310-335 SR

4/7/81 OR 4,260,928

United States Patent [19]

Salem

[11] 4,260,928

[45] Apr. 7, 1981

[54] ELECTRO-ACOUSTIC TRANSDUCER WITH HORN AND REFLECTOR

[75] Inventor: Robert J. Salem, Danbury, Conn.

[73] Assignee: General Electric Company, New York, N.Y.

[21] Appl. No.: 959,106

[22] Filed: Nov. 9, 1978

[51] Int. Cl.³ .................... H01L 41/08

[52] U.S. Cl. .................... 310/335; 310/324

[58] Field of Search .................... 310/322, 324, 334, 335; 73/632, 642; 179/110 A; 181/139, 142, 143, 152, 159, 185, 206, 400; 367/151, 157, 155

[56] References Cited

U.S. PATENT DOCUMENTS

| | | | |
|---|---|---|---|
| 2,967,957 | 1/1961 | Massa | 310/324 |
| 3,058,539 | 10/1962 | Adler | 310/335 X |
| 3,262,307 | 7/1966 | Hart | 310/335 X |
| 3,271,596 | 9/1966 | Brinkerhoff | 310/335 X |
| 3,510,698 | 5/1970 | Massa | 310/335 X |
| 3,716,681 | 2/1973 | Barrow | 310/324 |
| 3,849,679 | 11/1974 | Massa | 310/335 X |
| 3,860,838 | 1/1975 | Kumon | 310/335 X |
| 3,965,455 | 6/1976 | Hurwitz | 310/335 X |

*Primary Examiner*—Mark O. Budd
*Attorney, Agent, or Firm*—George R. Powers; Philip L. Schlamp; Joseph B. Forman

[57] ABSTRACT

An electrical-acoustical ultrasonic transducer horn arrangement for operating in a transmit or receive mode at a predetermined frequency ($f_c$) is described. The transducer horn arrangement includes a horn and an acoustical coupling means positioned within the horn for coupling acoustical energy between the horn and a limited area of a vibratory surface of the transducer.

12 Claims, 6 Drawing Figures

Fig. 2.
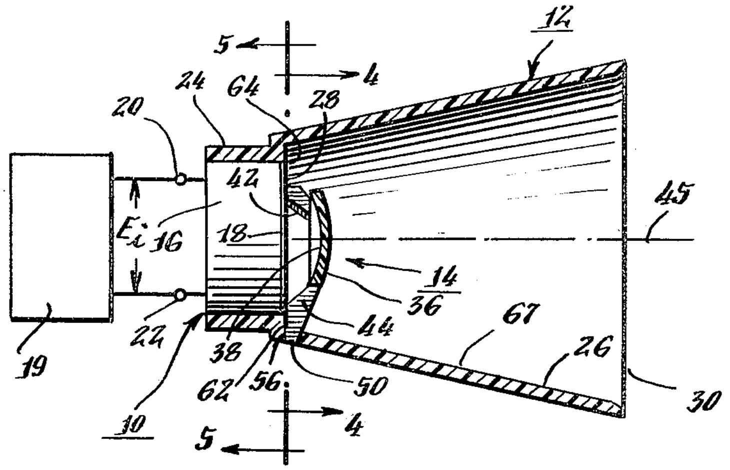
Fig. 1.
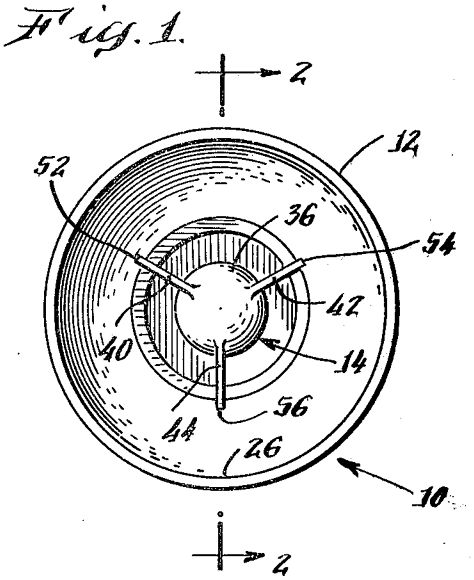
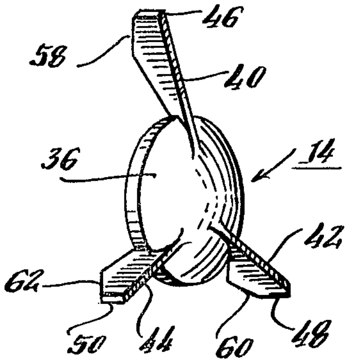
Fig. 3
Fig. 5.
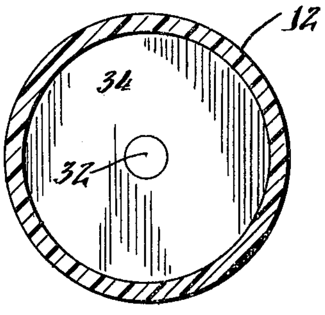
Fig. 4.
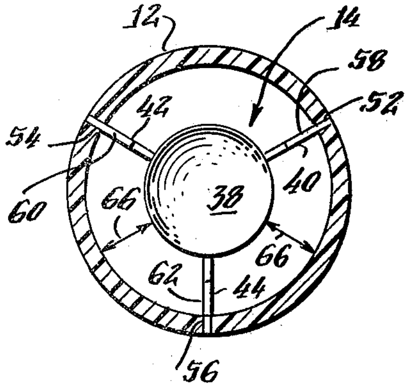
Fig. 6.
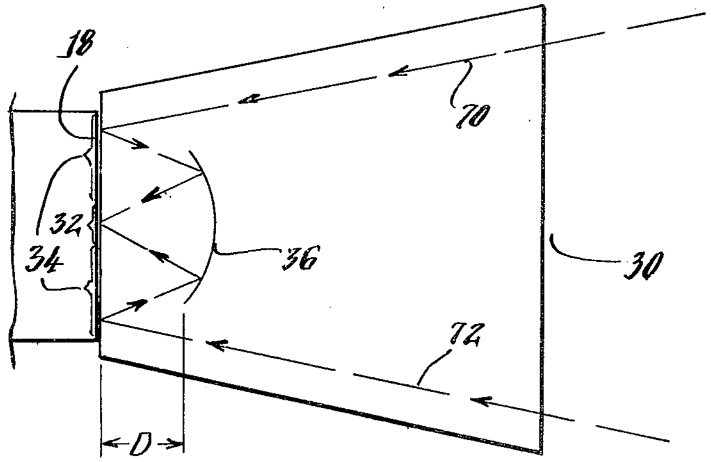

ELECTRO-ACOUSTIC TRANSDUCER WITH HORN AND REFLECTOR

BACKGROUND OF THE INVENTION

1. Field of the Invention

This invention relates to electrical-acoustical transducers. The invention relates more particularly to an improved means for providing coupling between the transducer and the atmosphere.

2. Description of the Prior Art

Electrical-acoustical transducers are known which can alternatively be utilized to convert electrical energy to acoustical energy when electrically excited or to convert acoustical energy to electrical energy when acoustically excited. One such form of transducer comprises a piezoelectric crystal and a vibratory surface or diaphragm which is mechanically coupled to the crystal for movement therewith. In an electrical-to-acoustical mode of operation, an exciting electrical input signal ($E_i$) is applied to terminals of the transducer; the crystal is stressed at the frequecny ($f_c$) of the input signal; and the vibratory surface is caused to vibrate with the stressed crystal at the frequency ($f_c$). In an acoustical-to-electrical mode of operation, acoustical energy which is incident upon the vibratory surface causes the surface to vibrate at an exciting acoustical frequency ($f_c$); the crystal is mechanically stressed as a result of the mechanical coupling to the vibratory surface; and, an electrical output signal ($E_o$) of frequency ($f_c$) is generated at the terminals of the transducer.

This form of dual operating transducer is useful in various applications where, for example, it is desirable to project ultrasonic acoustical energy and to sense reflections of the same. In these applications, which generally occur at a single frequency or at a sharply limited band of frequencies, a directional characteristic can be imparted to the transducer and the efficiency of coupling the transducer to the atmosphere can be enhanced through the use of an acoustical horn. One such arrangement utilizes a conically-shaped horm in conjunction with the transducer to project a relatively narrow beam of ultrasonic energy and to sense reflections of the same.

The above described transducer includes a vibratory surface having a finite area of predetermined configuration which is preferably symmetrical and circular. It has been found that electrical excitation of the transducer causes acoustical air pressures to be produced over a relatively limited central area of the vibratory surface which are greater than the pressures produced at segments of the vibratory surface distant from the central segment. Similarly, a concentration of exciting acoustical energy near this area produces an electrical output signal of relatively larger amplitude than is provided when the same acoustical energy is dispersed over the entire vibratory surface. This characteristic has an important effect in determining both the efficiency and sensitivity of the transducer.

It would be advantageous with respect to the efficiency of projection and with respect to the sensitivity of reception to provide an acoustical coupling means which couples the transducer to the atmosphere and which also compensates for the aforementioned characteristics of the vibratory surface.

SUMMARY OF THE INVENTION

Accordingly, it is an object of this invention to provide an improved, electrical-acoustical transducer horn arrangement for projecting and receiving ultrasonic acoustical energy.

Another object of the invention is to provide an improved transducer-horn arrangement for projecting and receiving ultrasonic acoustical energy at a single frequency or over a relatively narrow band of frequencies.

Another object of the invention is to provide an improved horn arrangement for use with a transducer having a planar vibratory surface.

Another object of the invention is to provide an improved horn arrangement for use with a piezoelectric type of transducer.

A further object of the invention is to provide a means for acoustically coupling a limited area of a vibratory surface of a transducer to an acoustical horn.

Another object is to provide an improved horn for use with an ultrasonic transducer.

Briefly, the invention in its more general aspect comprises an electrical-acoustical ultrasonic transducer having a vibratory surface, a horn for coupling the transducer and atmosphere, and acoustical coupling means, positioned within the horn for coupling acoustical energy between the horn and a limited area of the vibratory surface.

In accordance with more particular features of the invention, the acoustical coupling means comprises a reflective means positioned in the horn body and having a focal point located generally at the limited surface area of the vibratory surface. The reflective means is spaced apart from the vibratory surface by a distance $\lambda_c/4$, or multiple thereof, where $\lambda_c$ is the wavelength at the frequency ($f_c$) of excitation of the vibratory surface. In a preferred embodiment, the horn comprises an elongated frusto-conically shaped body having a first aperture thereof positioned adjacent to the vibratory surface. The reflective means comprises a curved, reflective body which is concave with respect to the vibratory surface, and which is concentrically located with respect to an axis of the horn. A means is provided for supporting the reflective body within the horn and enabling acoustical energy to propagate in an area between the horn and the body.

BRIEF DESCRIPTION OF THE DRAWINGS

These and other objects and features of the invention will become apparent with reference to the following specification and to the drawings wherein:

FIG. 1 is a front elevational view of a transducer constructed in accordance with the features of one embodiment of the invention;

FIG. 2 is a sectional view taken along lines 2—2 of FIG. 1;

FIG. 3 is an enlarged perspective view of a reflective body utilized with the transducer-horn arrangement of FIG. 1;

FIG. 4 is a view taken along line 4—4 of FIG. 2;

FIG. 5 is a view taken along the line 5—5 of FIG. 2; and

FIG. 6 is a diagramatic view of the transducer and horn of the invention which is useful in explaining the operation of the apparatus.

DETAILED DESCRIPTION

Referring now to the drawing and particularly to FIGS. 1 and 2, a transducer-horn arrangement is shown to comprise a transducer body 10, a horn body 12 and an acoustical coupling reflective means positioned within the horn body 12 for coupling the transducer to the horn and referred to generally by reference 14. The transducer body 10 includes a transducer housing 16 and a planar vibratory surface or diaphragm 18. For clarity in the drawing, the sectional view of FIG. 2 is taken through a section of the horn body 12 and the reflective means 14 but is not taken through a section of the transducer housing 16. An electrical signal ($E_i$) is derived from a circuit means 19 and is applied between terminals 20 and 22 of the transducer for electrically exciting the transducer. Alternatively, a voltage ($E_o$) is generated between these terminals when the transducer is acoustically excited by acoustical energy impinging on the vibratory surface 18. The output signal ($E_o$) is applied to the circuit means 19 for amplification and signal processing. The circuit means 19 comprises any suitable transducer driver adapted to drive and excite the transducer at a frequency ($f_c$), or in the alternative case, to amplify the signal ($E_o$) generated by the transducer. An exemplary circuit arrangement is a totem pole driver excited by an oscillator operating at the frequency ($f_c$). One such circuit means which is incorporated herein by reference is disclosed in my co-pending U.S. Patent Application entitled Improved Detection Method and Apparatus, Ser. No. 959,105, now U.S. Pat. No. 4,229,811. Although the same transducer-horn arrangement can be utilized both for transmitting and receiving, it is preferable that a separate transducer-horn be utilized for transmitting and separate transducer-horn be utilized for receiving.

The horn body 12 which is formed, for example, of a polymer plastic, includes an integrally formed cylindrically shaped transducer support segment 24 in which the transducer housing 16 is positioned and supported. Housing segment 16 and support segment 24 are dimensioned to provide a snug fit for retaining the transducer in this segment. Alternatively, the transducer can be retained by an adhesive. Integrally formed with the segment 24 of the horn body 12 is an elongated, frusto-conically shaped acoustical horn segment 26 having a first aperture 28 adjacent to the vibratory surface 18 and a second aperture 30 located at an opposite end of the segment 26. The vibratory surface is preferably symmetrical and circular shaped as shown and the second aperture 28 is substantially coextensive in area with this surface. Horn body 12 restricts divergence of acoustical energy and causes it to be propagated in a relatively narrow beam. The transducer-horn thus exhibits a directional characteristic upon transmitting and a directional characteristic upon receiving.

The transducer 10 comprises a piezoelectric transducer wherein a piezoelectric crystal (not illustrated) is mechanically coupled by means within the housing 16 to the vibratory surface 18. Upon application of an input signal ($E_i$) to the terminals 20 and 22, the electrical excitation will cause mechanical stressing of the crystal at the frequency ($f_c$) thereby causing the surface 18 to vibrate at the same frequency. Similarly, acoustical energy which propagates from the atmosphere, through the aperture 30 of the horn, and which is incident upon the surface 18 causes this surface to vibrate at the frequency of the incident acoustical energy. The piezoelectric crystal is thereby mechanically stressed causing an electrical signal ($E_o$) at the frequency of the incident acoustical energy to be generated at the terminals 20 and 22. This form of transducer is useful for applications at a single frequency ($f_c$) or over a narrow band of frequencies in the relatively low ultrasonic range. A particular ultrasonic frequency at which the transducer horn arrangement has been operated is 24 kh. The narrow band of frequencies can extend for about 50 to about 150 hertz.

The piezoelectric transducer is characterized by the generation of relatively high acoustical pressures over a limited, centrally located segment 32 of the surface 18. A relatively larger segment 34 of the surface 18 which is radially spaced from the segment 32 exhibits relatively lower pressure waves under the same electrical excitation. Because of this characteristic, acoustical energy which is incident and concentrated on the segment 32 will cause an output signal ($E_o$) relatively larger than an output signal when the same quantity of acoustical energy is distributed over the segments 32 and 34.

The acoustical coupling means 14 is positioned within the horn 12 for coupling acoustical energy between the horn segment 26 and the vibratory surface segment 32. The acoustical coupling means comprises a reflective means having a focal point which is located at a nodal point at the surface segment 32. The reflective means, in one embodiment, comprises a reflective body 36 having a concave reflective surface 38. A support means for the reflective body 36 includes a plurality of integrally formed support legs 40, 42 and 44 which extend both in the direction of a longitudinal axis 45 of the horn and in a transverse direction. Distal tab segments 46, 48 and 50 of the support legs 40, 42 and 44 respectively, extend through and engage slots 52, 54 and 56, respectively, which are formed in the horn body segment 26. The support legs 40, 42 and 44 also include integrally formed flat segments 58, 60 and 62 which abut against an internally located and integrally formed ridge 64 of the horn body 12. An adhesive, such as an epoxy resin secures the reflective body in place in the slots 52, 54 and 56. The tab segments 46, 48 and 50 and the flat segments 58, 60 and 62 locate the reflective body 36 concentrically with respect to the longitudinal axis 45 of the frusto-conical horn body segment 26. The leg segments also space the body 36 a distance (D) (FIG. 6), from the vibratory surface 18 where (D) is substantially equal to $\lambda_c/4$ and where $\lambda$ is the wavelength at the frequency of the exciting electrical signal ($E_i$) or the exciting acoustical energy. Since the cross sectional area of the body 36 is less than the cross sectional area of the conical section at the location (D), the concentric positioning of the body 36 provides a concentric ring of space, represented by reference numeral 66 (FIG. 4) between the body 36 and an inner surface 67 of the horn body segment 26. Acoustical energy propagates through this space 66 about the body 36 in passing between the aperture 30 and the vibratory surface 18.

The operation of the reflective means 14 in a receiving mode is illustrated in the diagram of FIG. 6. Reflected acoustical energy, represented by the rays 70 and 72 projects through the aperture 30 into the horn segment 26, through the circular ring of space 66 and impinges upon the vibratory surface 18. Acoustical energy is reflected from the surface area segment 34 toward the body 36 from which it is rereflected toward the limited area segment 32 of the vibratory surface 18. Through this arrangement, energy which would otherwise impinge upon the segment 34 of the vibratory surface is concentrated at the area 32 and the output voltage ($E_o$) resulting therefrom is substantially enhanced. In a similar manner, the relatively high pressure acoustical waves generated at the segment 32 upon electrical excitation of the transducer 10 is projected toward the body 36, reflected toward the distal segment 34 of the vibratory surface 18 and rereflected and projected through the horn and the second aperture 30 into the atmosphere. By this arrangement, divergence of the projected waves is reduced thereby enhancing the projection of a narrow beam of acoustical energy. The reflective means 14 thereby provides enhanced acoustical coupling between the vibratory surface of the transducer and the horn 26.

The spacing of the body 36 and its orientation within the horn can be varied in order to accommodate the particular needs of the application. In general, the body 36 should be spaced one-quarter wavelength, or multiple thereof, from a nodal point at the vibratory surface 18. Variations from this desired spacing can result in a substantial decrease in efficiency. The cross sectional area of the body 36 at the $\lambda_c/4$ location and the cross sectional area of the conical segment 26 at the $\lambda_c/4$ location are selected to both provide a concentric circular ring of space 66 which enables propagation of acoustical energy through the horn segment 26 to the surface 18, and, to provide a reflective surface 38 having an area which is adapted to reflect substantial portions of energy projected and reflected from the surface 18. These parameters can be varied to accomplish the desired needs.

The aforementioned transducer-horn arrangement is useful in various applications wherein ultrasonic acoustical energy is projected and reflected at a single frequency ($f_c$) or over a relatively narrow band ($\Delta f$) of frequencies. In a particular application, the transducer-horn arrangement has been used with an ultrasonic intrusion detection and alarm system as described in the aforementioned co-pending U.S. Patent application.

In a particular transducer-horn arrangement, which is not deemed limiting of the invention in any respect, the cross sectional area of the vibratory surface 18 had an area of about 0.785 in.$^2$; the body 36 was spaced from the surface 18 by a distance of about ⅛ in., and had a diameter at this location of 5/8 in. and a depth or spherical radius of ⅛ in. to provide a cross sectional area of about 0.245 in.$^2$; the circular section of the horn segment 26 at this location had a diameter of about 1¼ in. and a cross sectional area of about 1.22 in.$^2$; the second aperture 30 had a diameter of about 2¼ in. and a cross sectional area of about 4.42 in.$^2$; the length of the segment 26 along a longitudinal axis was 2¾ in; and, the first aperture 28 had a diameter of 1 in. and a cross sectional area of 0.785 in.$^2$. These parameters were provided for an ultrasonic transducer operating at a frequency of 24 Khz using a piezoelectric ultrasonic transducer commercially available and sold under the trade name MASSA. It was found that the reflective means 14 increased the effective signal strength of a received signal ($E_o$) by a factor of up to as much as about ten when compared with the same transducer and horn arrangement operated without the reflective means 14, and, has reduced the divergence of the propagated wave in a transmitting mode by as much as 15°.

There has thus been described an improved form of electrical-acoustical transducer having a means to couple acoustical energy between the horn and a limited area of a planar vibratory surface which enhances the sensitivity of the apparatus during a receive mode of operation under acoustical excitation, and, which reduces the divergence of a transmitted wave during a transit mode of operation under electrical excitation.

While there has been described a particular embodiment of the invention, it will be apparent to those skilled in the art that variations may be made thereto without departing from the spirit of the invention and the scope of the appended claims.

What is claimed is:

1. An improved electrical-acoustical transducer and horn arrangement comprising:

a. an electrical-acoustical transducer having a vibratory surface thereof and having a characteristic whereby electrical/acoustical transduction is accomplished relatively more efficiently over a limited segment of area of the vibratory surface than over other areas of the surface;

b. said transducer adapted to vibrate said surface at an ultrasonic frequency ($f_c$) responsive to an electrical signal applied thereto and to generate an electrical signal at a frequency ($f_c$) responsive to acoustical energy incident on said surface;

c. an elongated conically shaped horn body having a first aperture thereof;

d. means positioning said vibratory surface adjacent said first aperture; and e. acoustical coupling means positioned within the horn body for coupling acoustical energy between the horn and the limited segment area of the vibratory surface and including reflective means having a focal point in the limited segment area.

2. The transducer and horn arrangement of claim 1 wherein said reflective means is spaced apart from said vibratory surface by a distance of ($\lambda_c/4$) where $\lambda_c$ is the wavelength of acoustical energy at the frequency ($f_c$).

3. The transducer and horn arrangement of claim 2 wherein said vibratory surface is planar.

4. The transducer and horn arrangement of claim 1 wherein said transducer comprises a piezoelectric transducer.

5. The transducer and horn arrangement of claim 1 wherein said reflective means comprises a reflective body and means for supporting said reflective body in said horn.

6. The transducer and horn arrangement of claim 5 wherein said horn body includes a frusto-conically shaped segment.

7. The transducer and horn arrangement of claim 6 wherein said reflective body includes a concave surface positioned for reflecting acoustical energy projected or reflected from said vibratory surface toward said vibratory surface.

8. The transducer and horn arrangement of claim 7 wherein said concave surface comprises a segment of a hollow sphere.

9. The transducer and horn arrangement of claim 7 wherein said frusto-conically shaped segment has a plurality of slots spaced about said segment and said reflective body support means includes a plurality of support legs extending from said reflective body and engaging said slots.

10. The transducer and horn arrangement of claim 9 wherein said legs are integrally formed with said reflective body.

11. The transducer and horn arrangement of claim 9 wherein said horn body includes a surface thereof and said support legs include segments for engaging said surface for spacing said reflective body a predetermined distance from said vibratory surface.

12. The transducer and horn arrangement of claim 5 wherein said horn body has a longitudinal axis, said vibratory surface is circular, said limited area of said vibratory surface is centrally located and said vibratory surface and said reflective body is concentrically located with respect to said axis.

* * * * *